(12) United States Patent
Jang et al.

(10) Patent No.: US 6,822,503 B2
(45) Date of Patent: Nov. 23, 2004

(54) METHOD AND APPARATUS FOR SWITCHING INSULATED GATE FIELD EFFECT TRANSISTORS

(75) Inventors: Ki-young Jang, Incheon Metropolitan (KR); Bum-seok Suh, Kyungki-do (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

(21) Appl. No.: 10/462,000

(22) Filed: Jun. 11, 2003

(65) Prior Publication Data

US 2004/0051578 A1 Mar. 18, 2004

(30) Foreign Application Priority Data

Sep. 12, 2002 (KR) .................. 10-2002-0055386

(51) Int. Cl.[7] .............................................. H03K 17/62
(52) U.S. Cl. ...................................... 327/403; 327/434
(58) Field of Search ................................ 327/403, 404, 327/434, 587, 588

(56) References Cited

U.S. PATENT DOCUMENTS 5,909,108 A * 6/1999 He et al. .................... 323/225
6,323,717 B1 * 11/2001 Omura et al. ............... 327/434

* cited by examiner

*Primary Examiner*—Jeffrey Zweizig
(74) *Attorney, Agent, or Firm*—Townsend and Townsend and Crew LLP

(57) ABSTRACT

In accordance with the present invention, a method of switching first and second parallel-connected insulated gate bipolar transistors (IGBTs) is as follows. Each of the first and second IGBTs are turned on in alternating cycles of a system clock such that in any given cycle of the system clock only one of the first and second IGBTs is turned on.

23 Claims, 6 Drawing Sheets

| POWER DEVICE | | POWER CONSUMPTION [W] |
|---|---|---|
| RECTIFYING DIODE | | 7.6 X 4 |
| FAST RECOVERY DIODE | | 12.8 |
| IGBT | CONDUCTION LOSS | 8.5 X 2 |
| | SWITCHING LOSS | 12.4 X 2 |

METHOD AND APPARATUS FOR SWITCHING INSULATED GATE FIELD EFFECT TRANSISTORS

CROSS-REFERENCES TO RELATED APPLICATIONS

This application claims priority from Korean Patent Application No. 2002-55386, filed on Sep. 12, 2002, which is incorporated herein by reference in its entirety.

BACKGROUND OF THE INVENTION

The present invention relates in general to power electronics and more particularly to a method and apparatus for switching insulated gate field effect transistors (IGBTs).

In power systems using power semiconductor devices, if a power rating and a switching frequency increase, power consumption of the switching power devices increases. The high power consumption increases the junction temperature of the power devices which in turn may cause device reliability problems. One approach in addressing this problem has been to use two parallel-connected power devices and drive the gates of the two devices with two signals which have the same frequency and phase or two signals which have the same frequency but a predetermined phase difference.

FIG. 1 is a circuit diagram showing an example of a conventional switching circuit system having two IGBTs 110, 120, and FIG. 2 shows waveforms of the signals applied to the gates of IGBTs 110, 120. Referring to FIG. 1, IGBTs 110, 120 are connected together in parallel. An inductor L and a fast recovery diode $D_{FR}$ are respectively connected in series with a common collector terminal of IGBTs 110, 120. As can be seen, the system has a simplified structure and thus low cost.

As shown in FIG. 2, signals $PWM_{G1}$ and $PWM_{G2}$ respectively applied to gate terminals G1 of IGBT 110 and G2 of IGBT 120 have the same frequency and phase. As shown, the two signals have a fixed period T but are pulse-modulated, that is, the pulse widths may vary from one cycle to the next. However, both signals $PWM_{G1}$ and $PWM_{G2}$ have the same pulse modulation. Thus, IGBTs 110, 120 are turned on or off simultaneously. Ideally, when both IGBTs 110, 120 are simultaneously turned on to transfer current, the current and thus the generated heat are distributed between the two IGBTs. As such, the current rating is reduced in half which decreases power loss. However, in practice, the first IGBT 110 and the second IGBT 120 do not have the same characteristics due to variations in the manufacturing process. As a result, the current through IGBT 110 and IGBT 120 is not the same, and in the worst case, the semiconductor devices may be destroyed due to thermal imbalance.

FIG. 3 is a circuit diagram showing another example of a conventional switching circuit system having two IGBTs 210 and 220, and FIG. 4 shows waveforms of signals applied to the gates of the two IGBTs. Referring to FIG. 3, IGBTs 210, 220 have their collector terminals decoupled from each other. Inductor $L_1$ and $L_2$ are respectively connected to the collectors of IGBTs 220 and 210. Similarly, fast recovery diodes $D_{FR1}$ and $D_{FR2}$ are respectively connected to the collectors of IGBTs 220 and 210. Although not shown, inductors $L_1$ and $L_2$ are connected to an alternating current (AC) source through a rectifying circuit, and diodes $D_{FR1}$ and $D_{FR2}$ are connected to a load terminal. Alternatively, inductors $L_1$ and $L_2$ may be connected to a direct current (DC) source without passing through the rectifying circuit.

Pulse-modulated signals $PWM_{G1}$ and $PWM_{G2}$ are respectively applied to gate terminals G1 of IGBT 210 and G2 of IGBT 220. As shown in FIG. 4, signals $PWM_{G1}$ and $PWM_{G2}$ have the same period T but a phase difference of a half period T/2. Thus, depending on the pulse modulation, the duration in each cycle when the two IGBTs are turned on may overlap. By decoupling the collectors of the two IGBTs and providing each IGBT its own inductor and diode, the generated heat in each cycle is distributed between the two IGBTs and the overall thermal resistance is reduced, thus allowing this system to be used in high power systems. However, because this system requires an additional passive device such as an inductor, and an additional active device such as a fast recovery diode, the overall system becomes more complicated and more costly. Also, the characteristics of the two IGBTs 210, 220 are not the same, and similarly the characteristics of the two inductors $L_1$ and $L_2$ are not the same. Thus, in order to insure that the same current flows through the two parallel-connected blocks, an additional circuit for current sharing is needed.

Thus, an improved method and structure for switching IGBTs is desirable.

BRIEF SUMMARY OF THE INVENTION

In accordance with the present invention, a method of switching first and second parallel-connected insulated gate bipolar transistors (IGBTs) is as follows. Each of the first and second IGBTs are turned on in alternating cycles of a system clock such that in any given cycle of the system clock only one of the first and second IGBTs is turned on.

In one embodiment, a first signal having a frequency one half that of the system clock is generated for driving a gate terminal of the first IGBT. The first signal causes the first IGBT to turn on when the first signal is in a first state. a second signal having a frequency one half that of the system clock is generated for driving a gate terminal of the second IGBT. The second signal causes the second IGBT to turn on when the second signal is in the first state.

In another embodiment, the system clock is a fixed frequency pulse-modulated clock.

In accordance with another embodiment of the present invention, an apparatus includes first and second IGBTs connected together in parallel. A driving circuit is configured to generate a first signal for turning on the first IGBT in every other cycle of a system clock, and to generate a second signal for turning on the second IGBT in every other cycle of the system clock such that in any given cycle of the system clock only one of the first and second IGBTs is turned on.

In one embodiment, in response to at least the system clock, the driving circuit generates the first and second signals each having a frequency one half that of the system clock.

In another embodiment, the driving circuit further includes a trigger flip-flop configured to generate a third signal and a fourth signal in response to at least the system clock. The fourth signal is a complement of the third signal.

In another embodiment, the trigger flip-flop is configured so that the third signal makes a transition only in response to every falling edge of the system clock.

In another embodiment, the trigger flip-flop is configured so that the third signal makes a transition only in response to every rising edge of the system clock.

In another embodiment, the driving circuit further includes a first logic gate configured to generate the first signal and a second logic gate configured to generated the second signal. The first logic gate performs and AND function on the third signal and the system clock, and the second logic gate performs and AND function on the fourth signal and the system clock.

In another embodiment, the trigger flip-flop is a clocked J-K flip-flop in which terminals J and K are connected to a high logic level.

In accordance with yet another embodiment of the present invention, a power factor corrector system includes a rectifier circuit coupled to convert an AC signal to a DC signal, and first and second IGBTs connected together in parallel. An inductor is coupled between the rectifier and a common collector of the first and second IGBTs. A fast recovery diode is coupled between a capacitor and the common collector of the first and second IGBTs. A driving circuit coupled to turn on the first IGBT in every other cycle of a fixed frequency pulse-modulated system clock, and to turn on the second IGBT in every other cycle of the system clock such that in any given cycle of the system clock only one of the first and second IGBTs is turned on.

In one embodiment, in response to at least the system clock, the driving circuit generates a first signal and a second signal each having a frequency one half that of the system clock. The first signal is coupled to a gate terminal of the first IGBT and the second signal is coupled to a gate terminal of the second IGBT.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

In accordance with the present invention, a switching method and apparatus are provided wherein each of two parallel-connected IGBTs are turned on in alternating cycles of a pulse-modulated system clock such that in any given cycle of the system clock only one of the first and second IGBTs is turned on. Among other advantages, this insures that the two IGBTs are not destroyed due to an imbalance of current through the two IGBTs.

Figure 1:
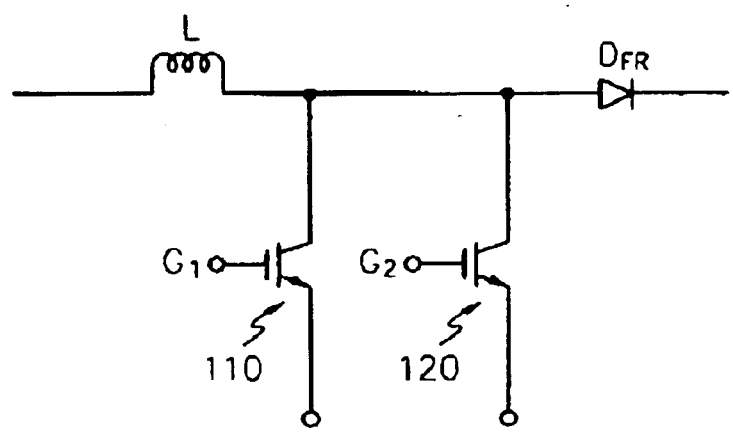
FIG. 1 is a circuit diagram showing an example of a conventional switching circuit system.
Figure 2:
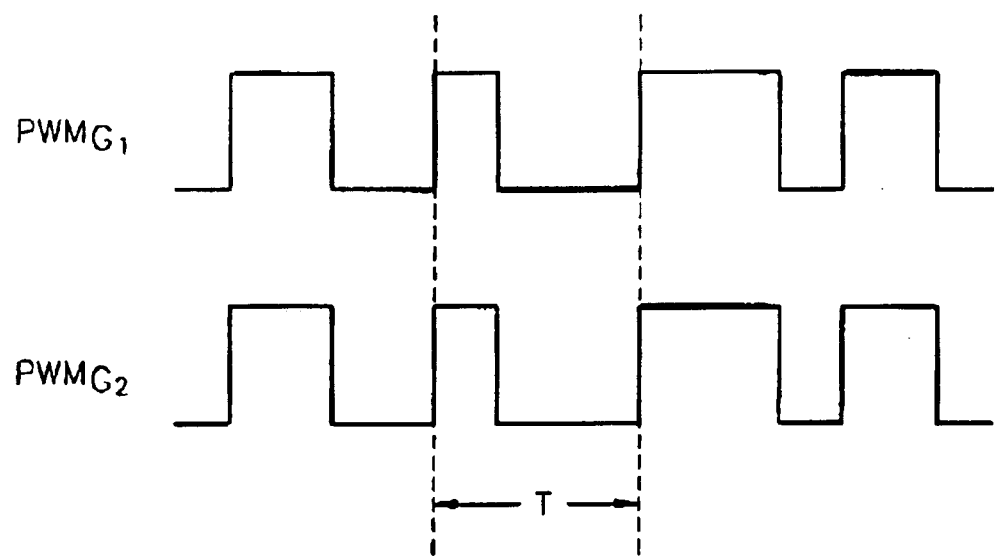
FIG. 2 shows waveforms of two signals respectively applied to the gate terminals of two insulated gate bipolar transistors (IGBTs) shown in FIG. 1.
Figure 3:
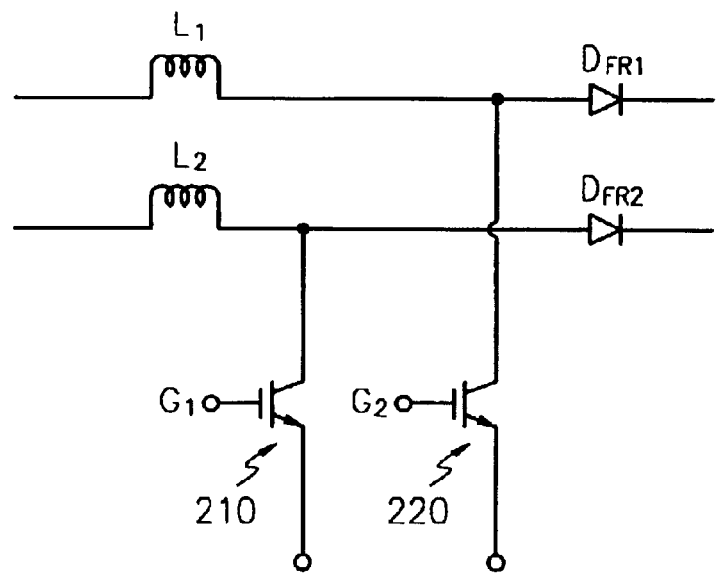
FIG. 3 is a circuit diagram showing another example of a conventional switching circuit system.
Figure 4:
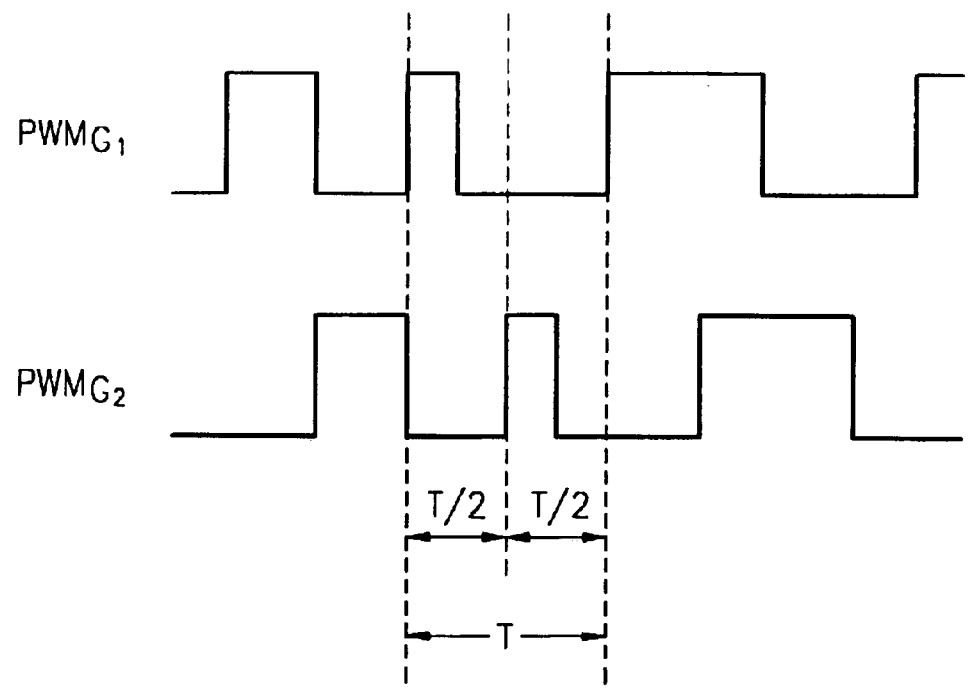
FIG. 4 shows waveforms of two signals respectively applied to the gate terminals of two IGBTs shown in FIG. 3.
Figure 5:
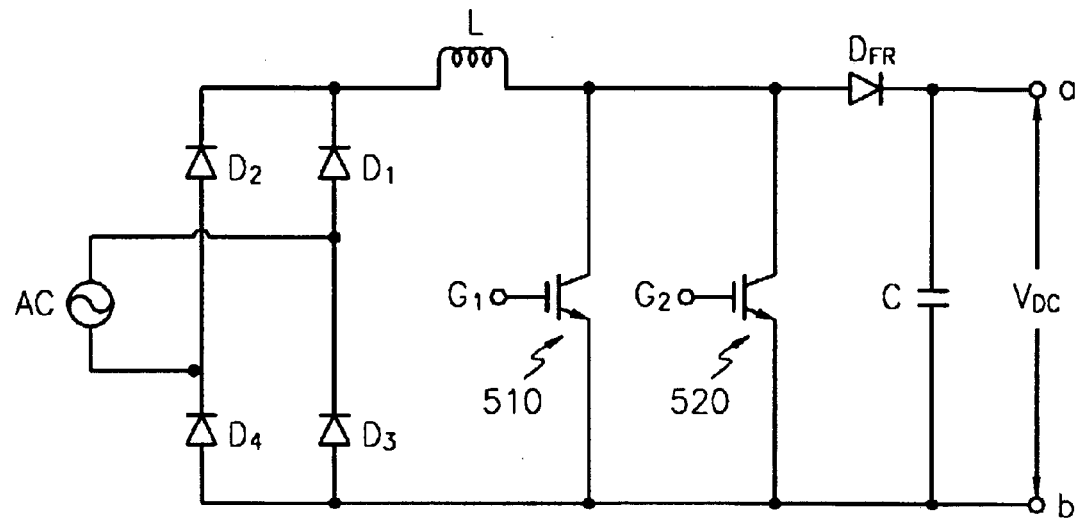
FIG. 5 is a circuit diagram of a switching circuit system for implementing a switching method, according to an embodiment of the present invention.
Figure 6:
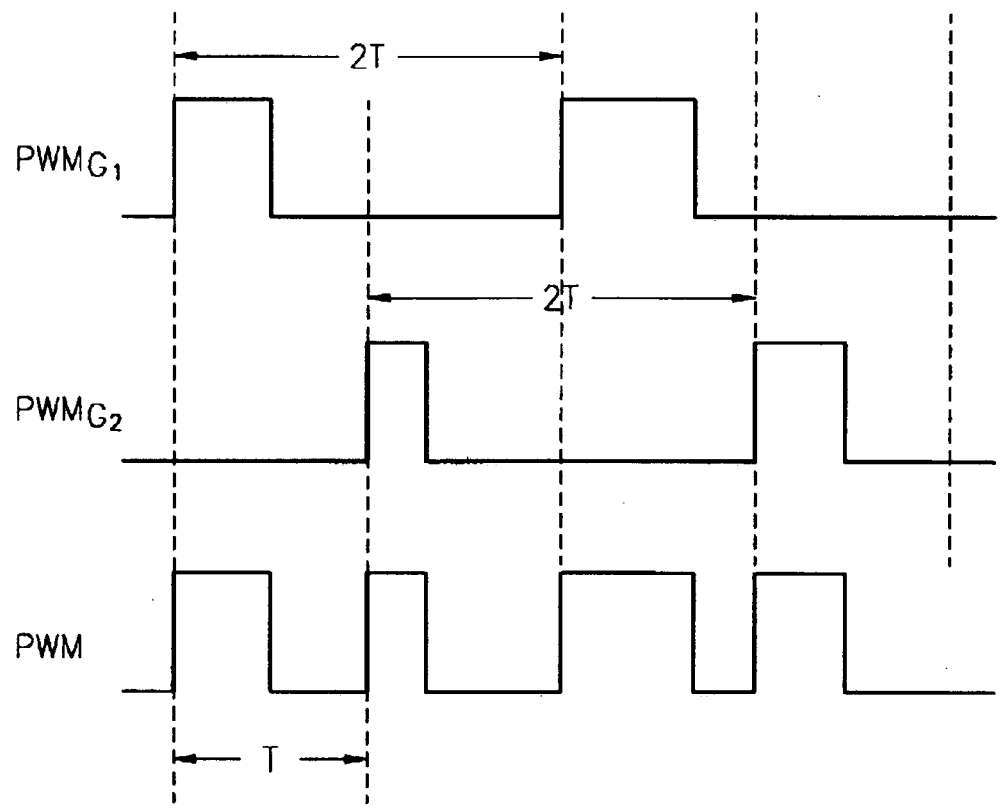
FIG. 6 shows waveforms of signals including two signals respectively applied to the gate terminals of two IGBTs shown in FIG. 5.

FIG. 5 is a circuit diagram of a switching circuit system, i.e., power factor corrector (PFC), for implementing a switching method according to an embodiment of the present invention. FIG. 6 shows waveforms of signals two of which are respectively applied to the gates of two IGBTs in FIG. 5. Referring to FIG. 5, an alternating current (AC) source is connected to a rectifier comprising rectifying diodes $D_1$, $D_2$, $D_3$, and $D_4$. Two IGBTs 510 and 520 are connected in parallel to one another. An inductor L is connected between a common collector terminal of IGBTs 510, 520 and the rectifier. A fast recovery diode $D_{FR}$ is connected between the common collector terminal of IGBTs 510, 520 and a capacitor C.

The AC source is rectified to a direct current (DC) by rectifying diodes $D_1$, $D_2$, $D_3$, and $D_4$. Inductor L acts like a pump, receiving energy when either of IGBTs 510 and 520 is on, and transferring it to capacitor C when IGBTs 510, 520 are off. When either of IGBTs 510 and 520 is on, the current through inductor L increases and the energy stored in the inductor builds up. During this time, diode $D_{FR}$ does not conduct and capacitor C sustains a voltage $V_{DC}$ across terminal ab. When IGBTs 510, 520 are both off, diode $D_{FR}$ is on and inductor L discharges its energy through diode $D_{FR}$. During this time, capacitor C transmits charged energy, i.e., voltage $V_{DC}$ across terminal ab, to a load (not shown) connected to terminal ab. Diode $D_{FR}$ prevents a current from capacitor C to flow back into the circuit when either of IGBTs 510 and 520 is turned on.

Signals $PWM_{G1}$ and $PWM_{G2}$ (FIG. 6) are respectively applied to gate terminals G1 of IGBT 510 and G2 of IGBT 520. As shown in FIG. 6, a system signal PWM has a period T while each of $PWM_{G1}$ and $PWM_{G2}$ signals has a period of 2T. Signals $PWM_{G1}$ and $PWM_{G2}$ are arranged such that the positive-going pulses of one signal alternate with but do not overlap the positive-going pulses of the other signal. This insures that the periods during which IGBT 510 is in the on state do not overlap with the periods during which IGBT 520 is in the on state, and also during consecutive cycles of system signal PWM, IGBTs 510, 520 are turned on alternately.

Accordingly, when the switching circuit system performs a switching function, because IGBT 510 and IGBT 520 are not simultaneously on, current is not distributed between them. Thus, a circuit to insure current sharing is not required. Further, heating is distributed between IGBTs 510 and 520 and thus a high power alternating current (AC) input source can be used in the switching circuit system. Moreover, additional active and passive circuit components are not needed, and thus, the circuit system has a simplified structure and low cost.

Figure 7:
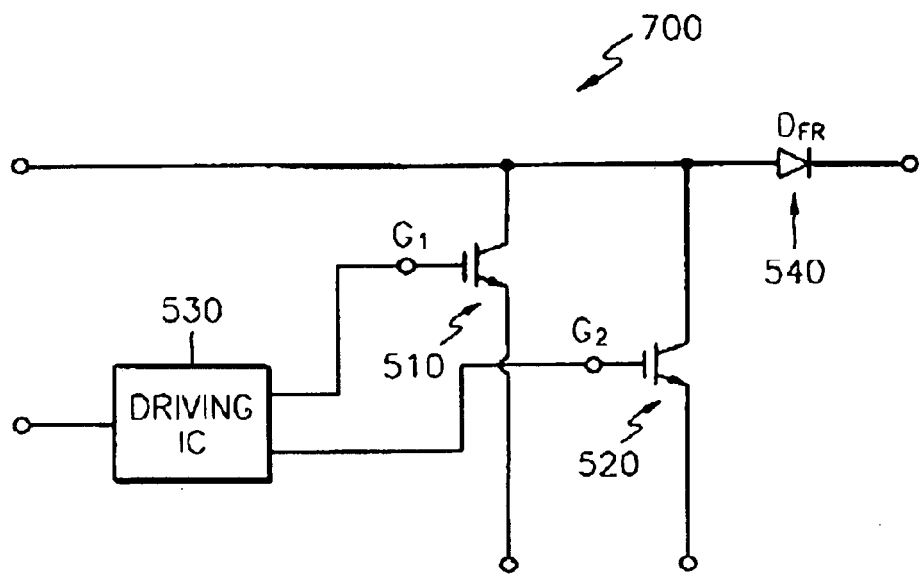
FIG. 7 shows an IGBT module for implementing a switching method according to an embodiment of the present invention.

FIG. 7 shows an IGBT module 700 for implementing a switching method according to one embodiment of the present invention. IGBT module 700 includes two IGBTs 510 and 520, a driving integrated circuit (IC) 530, and a fast recovery diode $D_{FR}$ 540. The two IGBTs 510, 520 are parallel-connected to one another. External terminals of IGBT module 700 include an input terminal of driving IC 530, a line terminal connected to a collector terminal, and a common emitter terminal of IGBTs 510, 520. Two outputs of driving IC 530 are respectively coupled to gate terminals G1 of IGBT 510 and G2 of IGBT 520. An anode terminal of diode $D_{FR}$ 540 is connected to the common collector terminal of IGBTs 510, 520, and a cathode terminal of $D_{FR}$ 540 is connected to an external output terminal of IGBT module 700.

Figure 8:
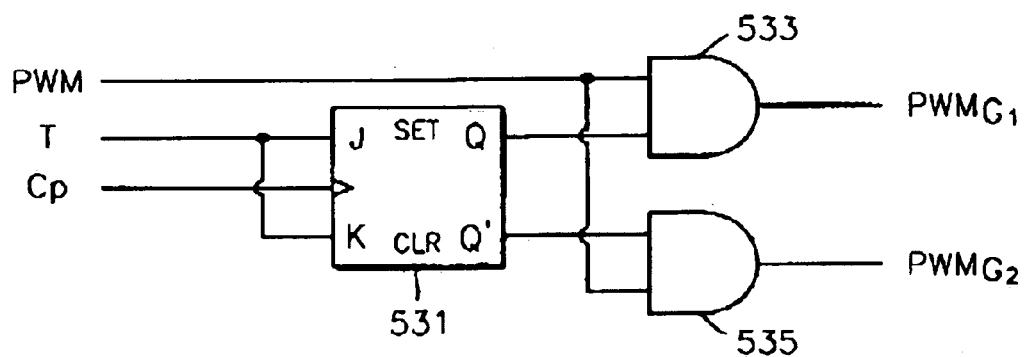
FIG. 8 is a circuit diagram showing the structure of a driving integrated circuit (IC) in the IGBT module in FIG. 7, according to an embodiment of the present invention.
Figures 9, 10:
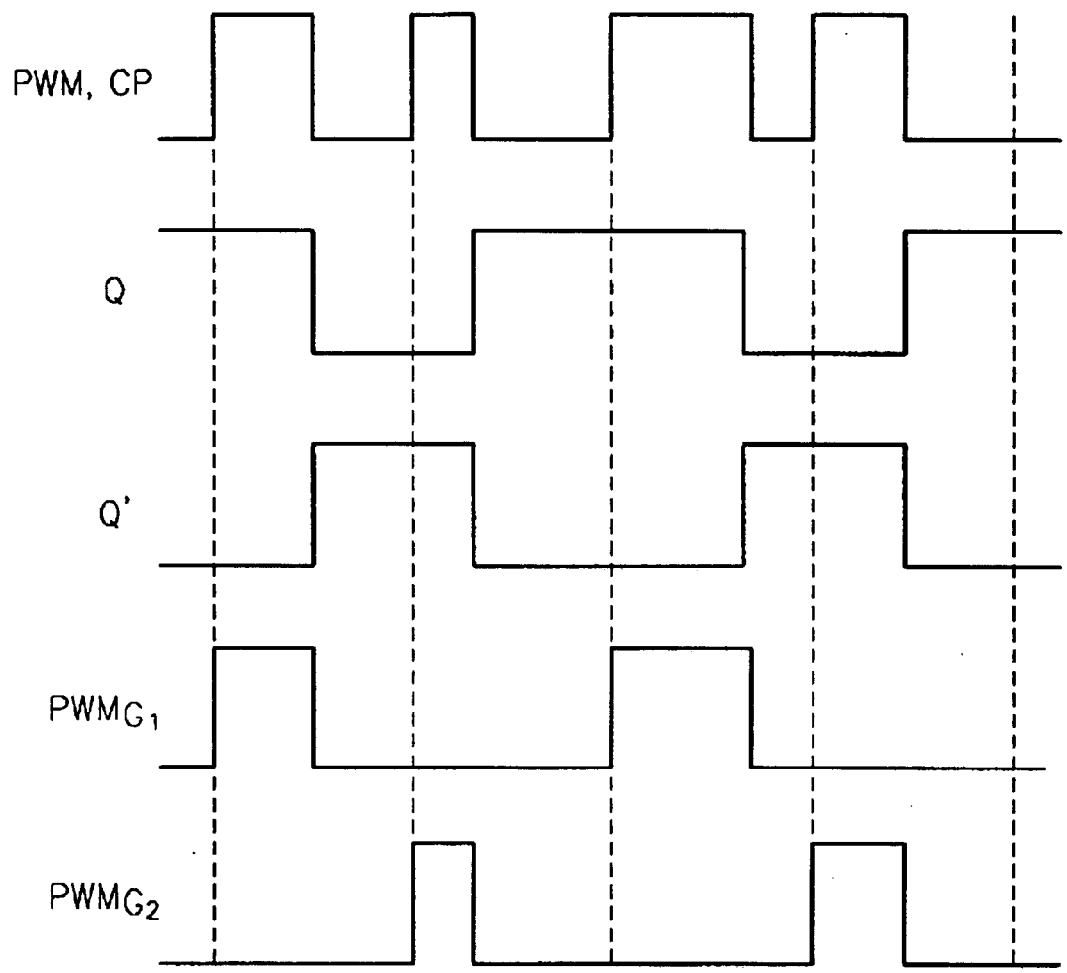
FIG. 9 is a timing diagram showing input and output signals of the circuit elements of the driving IC shown in FIG. 8.
FIG. 10 is a table showing measured power consumption of each of the circuit elements of the switching system shown in FIG. 5 when a switching method according to the present invention is implemented.

FIG. 8 is a circuit diagram showing the structure of a driving integrated circuit (IC) for use as block 530 in IGBT module 700 in FIG. 7, according to one embodiment of the present invention. FIG. 9 is a timing diagram showing input and output signals for elements of the driving IC shown in FIG. 8. Referring to FIG. 8, the driving IC includes a trigger flip-flop 531, and two two-input AND gates 533 and 535. Trigger flip-flop 531 may be implemented by connecting terminals J and K of a clocked J-K flip-flop to each other. A "1" is permanently input to the terminals J and K of trigger flip-flop 531. Thus, a signal output from a terminal Q of flip-flop 531 is toggled (i.e., changes from a "1" to a "0" or from a "0" to a "1") whenever a clock pulse CP is input. In one embodiment, the toggling occurs at each falling edge of clock pulse CP. A pulse signal PWM having a period T is the same as clock pulse CP. Pulse signal PWM is applied to an input terminal of each of AND gates 533 and 535. The other input terminal of AND gate 533 is coupled to output terminal Q of trigger flip-flop 531, and the other input terminal of AND gate 535 is connected to output terminal Q' of trigger flip-flop 531.

As shown in FIG. 9, the signal at output terminal Q of trigger flip-flop 531 is toggled at each falling edge of clock pulse CP. Similarly, a signal at the output terminal Q' is toggled at each falling edge of the clock pulse CP to have a value opposite to the signal output on output terminal Q. AND gate 533 generates signal $PWM_{G1}$ which reflects an AND operation between pulse signal PWM and the signal at output terminal Q. Thus, AND gate 533 generates a high-going pulse corresponding to every other positive-going pulse of pulse signal PWM. Similarly, AND gate 535 generates signal $PWM_{G2}$ which reflects an AND operation between pulse signal PWM and the signal at output terminal Q'. Thus, AND gate 535 generates a positive-going pulse corresponding to every other high-going pulse of pulse signal PWM. As shown in FIG. 9, AND gates 533 and 535 thus generate alternating and non-overlapping positive-going pulses during consecutive cycles of pulse signal PWM. This insures that the periods during which IGBT 510 is in the on state do not overlap with the periods during which IGBT 520 is in the on state, and also during consecutive cycles of pulse signal PWM IGBTs 510, 520 are turned on alternately (i.e., neither of IGBTs 510, 520 is turned on in two consecutive cycles of pulse signal PWM).

FIG. 10 is a table showing measured power consumption of each of elements of the switching system shown in FIG. 5 when a switching method according to the present invention is implemented. The measurements were made under following conditions: input voltage source 176–264 V, voltage $V_{DC}$ across capacitor C 400V, switching frequency $f_s$, 25 kHz, and input power $P_{IN}$ 3 kW.

As shown in FIG. 10, power consumption of rectifying diodes $D_1$, $D_2$, $D_3$, and $D_4$ is 7.6×4 W, power consumption of fast recovery diode $D_{FR}$ is 12.8 W, and the sum of conduction loss and switching loss of the two IGBTs 510, 520 is (8.5×2)+(12.4×2) W which equal 41.8 W. Conduction loss and switching loss of the rectifying diodes $D_1$, $D_2$, $D_3$, and $D_4$ and fast recovery diode $D_{FR}$ are measured independent of the number of IGBTs. However, when only one IGBT having twice the current rating is used, as in the prior art, the power consumption of the IGBT is 13.4 +24.8 W which equals 38.2 W. Thus, when the two IGBTs 510, 520 and a switching method according to the present invention are implemented, the power consumption of the two IGBTs 510, 520 is slightly higher than the power consumption of the prior art wherein only one IGBT is used, but an increase in the power consumption of the two IGBTs 510 and 520 is not the same as the measured power consumption.

Figure 11:
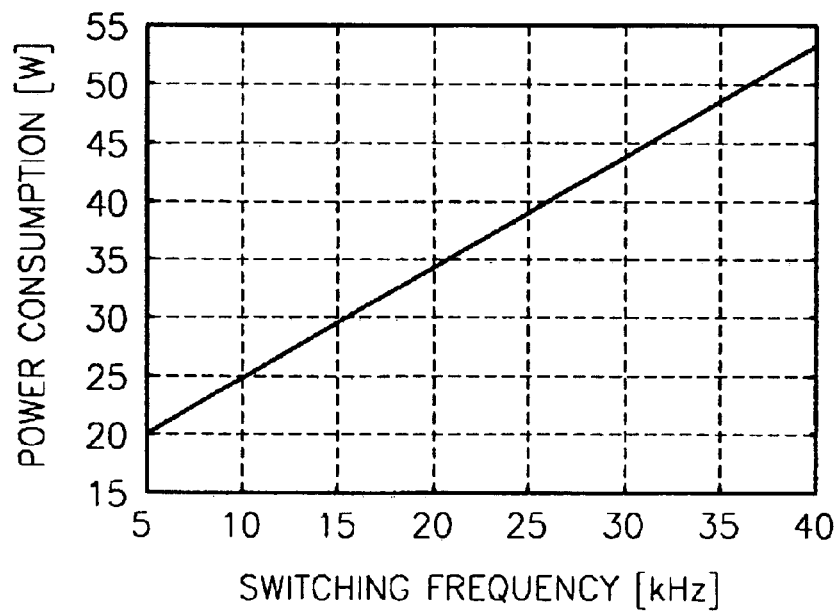
FIG. 11 is a graph showing switching frequency versus power consumption of one IGBT when only one IGBT is used as the switching device.
Figure 12:
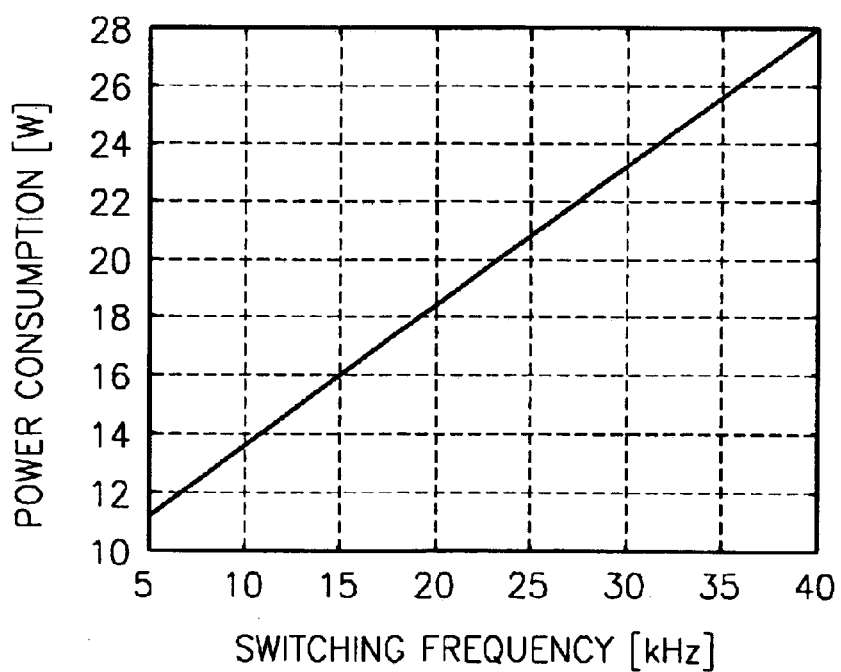
FIG. 12 is a graph showing switching frequency versus power consumption of one IGBT when two IGBTs are used as a switching device so as to implement the switching method according to the present invention.

FIG. 11 is a graph showing switching frequency versus power consumption of one IGBT wherein only one IGBT is used as a switching device as in the prior art. FIG. 12 is a graph showing switching frequency versus power consumption of one IGBT when two IGBTs are used as a switching device so as to implement the switching method according to the present invention.

Among the different measurement conditions, the switching frequency $f_s$, affects power consumption the most. In FIG. 11 wherein only one IGBT is used as the switching device, the power consumption of the IGBT is 38.2 W at the switching frequency $f_s$, of 25 kHz. However, in FIG. 12 wherein the switching method according to the present invention is implemented using two IGBTs, the power consumption of each of the two IGBTs is 20.9 W at the switching frequency $f_s$, of 25 kHz. Thus, power consumption for each IGBT can be reduced, and even though the total power consumption of the two IGBTs (41.8 W) is slightly higher, the overall generated heat is better distributed between the two IGBTs.

As described above, a switching circuit system performs a switching function by alternately turning on two IGBTs in such manner that whenever one of the IGBTs is in the on state, the other IGBT is in the off state (i.e., the two IGBTs are never on at the same time). Thus, current distribution need not be considered. In addition, the generated heat is distributed between the two IGBTs such that a high input power can be used in the switching system. Further, additional external logic circuits and other circuit components are not needed so that simplified circuit system and thus low cost are achieved.

While this invention has been particularly shown and described with reference to a preferred embodiment thereof, it will be understood by those skilled in the art that various changes in form and details may be made therein without departing from the spirit and scope of the invention as defined by the appended claims and equivalents thereof.

What is claimed is:

1. A method of switching first and second parallel-connected insulated gate bipolar transistors (IGBTs), the method comprising:
   turning on each of the first and second IGBTs in alternating cycles of a system clock such that in any given cycle of the system clock only one of the first and second IGBTs is turned on.

2. The method of claim 1 wherein the first and second IGBTs are not simultaneously on during any cycle of the system clock.

3. The method of claim 1 further comprising:
   generating a first signal having a frequency one half that of the system clock for driving a gate terminal of the first IGBT, the first signal causing the first IGBT to turn on when in a first state; and generating a second signal having a frequency one half that of the system clock for driving a gate terminal of the second IGBT, the second signal causing the second IGBT to turn on when in the first state.

4. The method of claim 1 wherein the system clock is a fixed frequency pulse-modulated clock.

5. A method of switching first and second parallel-connected insulated gate bipolar transistors (IGBTs) in a system having a fixed frequency pulse-modulated clock, the method comprising:

generating a first signal having a frequency one half that of the system clock, the first signal causing the first IGBT to turn on in every other cycle of the system clock; and generating a second signal having a frequency one half that of the system clock, the second signal causing the second IGBT to turn on in every other cycle of the system clock such that in any given cycle of the system clock only one of the first and second IGBTs is turned on.

6. An apparatus comprising:

first and second IGBTs connected together in parallel; and a driving circuit coupled to turn on each of the first and second IGBTs in alternating cycles of a system clock such that in any given cycle of the system clock only one of the first and second IGBTs is turned on.

7. The apparatus of claim 6 wherein in response to at least the system clock, the driving circuit generates first and second signals respectively coupled to a gate terminal of the first IGBT and a gate terminal of the second IGBTs, each of the first and second signals having a frequency one half that of the system clock.

8. The apparatus of claim 6 wherein a collector terminal of each of the first and second IGBTs is connected together, and an emitter terminal of each of the first and second IGBTs is connected together, the driving circuit comprising:

a first input terminal for receiving the system clock;

a first output terminal on which the first signal is provided, the first output terminal being connected to a gate terminal of the first IGBT; and a second output terminal on which the second signal is provided, the second output terminal being connected to a gate terminal of the second IGBT.

9. The apparatus of claim 6 wherein the system clock is a fixed frequency pulse-modulated clock.

10. The apparatus of claim 7 wherein the driving circuit further comprises:

a trigger flip-flop configured to generate a third signal and a fourth signal in response to at least the system clock, the fourth signal being a complement of the third signal.

11. The apparatus of claim 10 wherein the trigger flip-flop is configured so that the third signal makes a transition only in response to every falling edge of the system clock.

12. The apparatus of claim 10 wherein the trigger flip-flop is configured so that the third signal makes a transition only in response to every rising edge of the system clock.

13. The apparatus of claim 10 wherein the driving circuit further comprises:

a first logic gate configured to generate the first signal, the first logic gate performing and AND function on the third signal and the system clock; and a second logic gate configured to generate the second signal, the second logic gate performing and AND function on the fourth signal and the system clock.

14. The circuit of claim 10, wherein the trigger flip-flop is a clocked J-K flip-flop in which terminals J and K are connected to each other.

15. The circuit of claim 10, wherein the trigger flip-flop is a clocked J-K flip-flop in which the terminals J and K are connected to a high logic level.

16. A power factor corrector system comprising:

a rectifier circuit coupled to convert an AC signal to a DC signal;

first and second IGBTs connected together in parallel;

an inductor coupled between the rectifier and a common collector of the first and second IGBTs;

a fast recovery diode coupled between a capacitor and the common collector of the first and second IGBTs; and a driving circuit coupled to turn on each of the first and second IGBTs in alternating cycles of a fixed frequency pulse-modulated system clock such that in any given cycle of the system clock only one of the first and second IGBTs is turned on.

17. The power factor corrector system of claim 16 wherein in response to at least the system clock, the driving circuit generates a first signal and a second signal each having a frequency one half that of the system clock, the first signal being coupled to a gate terminal of the first IGBT and the second signal being coupled to a gate terminal of the second IGBT.

18. The power factor corrector system of claim 17 wherein the driving circuit further comprises:

a trigger flip-flop configured to generate a third signal and a fourth signal in response to at least the system clock, the fourth signal being a complement of the third signal.

19. The power factor corrector system of claim 18 wherein the trigger flip-flop is configured so that the third signal makes a transition only in response to every falling edge of the system clock.

20. The power factor corrector system of claim 18 wherein the trigger flip-flop is configured so that the third signal makes a transition only in response to every rising edge of the system clock.

21. The apparatus of claim 18 wherein the driving circuit further comprises:

a first logic gate configured to generate the first signal, the first logic gate performing and AND function on the third signal and the system clock; and a second logic gate configured to generate the second signal, the second logic gate performing and AND function on the fourth signal and the system clock.

22. The circuit of claim 21, wherein the trigger flip-flop is a clocked J-K flip-flop in which terminals J and K are connected to each other.

23. The circuit of claim 22, wherein the terminals J and K are connected to a high logic level.

* * * * *